United States Patent
Cao

(10) Patent No.: US 7,944,023 B2
(45) Date of Patent: May 17, 2011

(54) STRAINED SI FORMED BY ANNEAL

(75) Inventor: Min Cao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/714,442

(22) Filed: Mar. 6, 2007

(65) Prior Publication Data

US 2007/0284579 A1 Dec. 13, 2007

Related U.S. Application Data

(62) Division of application No. 10/860,165, filed on Jun. 3, 2004, now Pat. No. 7,202,145.

(51) Int. Cl.
*H01L 21/02* (2006.01)

(52) U.S. Cl. . 257/616; 257/190; 257/613; 257/E21.182; 257/E21.207

(58) Field of Classification Search ........... 257/E21.182, 257/E21.207, 613, 616, 190
See application file for complete search history.

(56) References Cited

U.S. PATENT DOCUMENTS

| | | | |
|---|---|---|---|
| 3,993,533 A * | 11/1976 | Milnes et al. | 117/88 |
| 5,273,930 A | 12/1993 | Steele et al. | |
| 5,461,243 A | 10/1995 | Ek et al. | |
| 5,891,769 A | 4/1999 | Liaw et al. | |
| 5,906,951 A * | 5/1999 | Chu et al. | 438/751 |
| 6,313,016 B1 | 11/2001 | Kibbel et al. | |
| 6,326,667 B1 * | 12/2001 | Sugiyama et al. | 257/347 |
| 6,369,438 B1 * | 4/2002 | Sugiyama et al. | 257/616 |
| 6,500,732 B1 * | 12/2002 | Henley et al. | 438/459 |
| 6,562,736 B2 | 5/2003 | Yanagawa et al. | |
| 6,690,043 B1 * | 2/2004 | Usuda et al. | 257/194 |
| 6,723,621 B1 * | 4/2004 | Cardone et al. | 438/478 |
| 6,861,316 B2 * | 3/2005 | Hara et al. | 438/285 |
| 6,878,610 B1 | 4/2005 | Lin et al. | |
| 7,449,379 B2 * | 11/2008 | Ochimizu et al. | 438/199 |
| 2002/0090772 A1 | 7/2002 | Higashi | |
| 2004/0067644 A1 * | 4/2004 | Malik et al. | 438/689 |
| 2004/0227158 A1 | 11/2004 | Delhougne et al. | |
| 2004/0245552 A1 | 12/2004 | Shiono et al. | |
| 2005/0051851 A1 * | 3/2005 | Chen et al. | 257/369 |
| 2005/0260809 A1 * | 11/2005 | Tezuka et al. | 438/199 |
| 2006/0220127 A1 * | 10/2006 | Mantl | 257/347 |

* cited by examiner

*Primary Examiner* — Kenneth A Parker
*Assistant Examiner* — Jay C Kim
(74) *Attorney, Agent, or Firm* — Duane Morris LLP

(57) ABSTRACT

A semiconductor structure includes a silicon substrate layer, a relaxed silicon-germanium layer on the silicon substrate layer and a strained single crystal silicon layer on the silicon-germanium layer. The silicon-germanium layer may include a thickness of 500 angstroms or less. The method for forming the semiconductor structure includes epitaxially forming the silicon-germanium layer and the single crystal silicon layer. The silicon-germanium layer is stressed upon formation. After the single crystal silicon layer is formed over the silicon-germanium layer, an RTA or laser heat treatment process selectively melts the silicon-germanium layer but not the single crystal silicon layer. The substantially molten silicon-germanium relaxes the compressive stresses in the silicon-germanium layer and yields a relaxed silicon-germanium layer and a strained single crystal silicon layer upon cooling.

10 Claims, 3 Drawing Sheets

//]: #

STRAINED SI FORMED BY ANNEAL

RELATED APPLICATIONS

This is a divisional application of, and claims priority from, U.S. patent application Ser. No. 10/860,165, filed Jun. 3, 2004 now U.S. Pat. No. 7,202,145, the contents of which are hereby incorporated by reference as if set forth in their entirety.

FIELD OF THE INVENTION

This invention relates, in general, to semiconductor processing and more particularly, to methods for forming multi-layer structures with strained heterojunctions in semiconductor devices.

BACKGROUND OF THE INVENTION

Strained semiconductor heterostructures are useful for a wide variety of device applications where a narrowed bandgap can improve device performance. Multilayer semiconductor structures comprising heterojunctions are useful in the fabrication of numerous different electronic and optoelectronic devices, one of the most significant electronic devices being bipolar transistors. Strained heterojunction semiconductor devices are also advantageously used as the channel or source/drain regions of PMOS or NMOS metal oxide semiconductor field effect transistors (MOSFET's). For example, in heterojunction MOSFET devices, a strained channel region enhances carrier mobility within the channel. In strained silicon channel regions, the strained silicon layer typically is formed on a substrate layer of greater lattice parameters than that of silicon. A relaxed silicon-germanium layer is a suitable material for such a substrate layer because of its compatibility with silicon processing. As such, a strained silicon layer formed over a relaxed silicon-germanium layer is particularly advantageous.

One known approach to forming a strained silicon channel layer involves growing a silicon layer on an as-grown relaxed or unstrained SiGe layer. The relaxed SiGe layer is formed by first growing a graded $Si_{1-x}Ge_x$ layer on a silicon substrate where x increases from 0% to 30% over a thickness of about 1.5 microns. Next, a 1.0 micron layer of $Si_{0.7}Ge_{0.3}$ is grown over the graded layer following a thin $Si_{1-x}Ge_x$ layer where x decreases from 30% to 0% over a thickness of about 0.03 microns. This approach has several disadvantages including a high epitaxial film cost because it takes approximately 6-8 hours to grow the different layers. Additionally, this approach results in a high concentration of dislocations because of the thick expitaxial layers. In addition to reducing the concentration of such dislocations and reducing costs, a thinner $Si_{1-x}Ge_x$ epitaxial layer provides improved heat conduction, reduced junction capacitance and reduced junction leakage.

Accordingly, methods are needed for forming multilayer heterojunction devices having strained silicon layers formed on relaxed layers, and low defect levels. It would be further advantageous to utilize thinner epitaxial layers for such a purpose.

SUMMARY OF THE INVENTION

To achieve these and other objects, and in view of its purposes, the invention provides a method for forming a semiconductor structure and the semiconductor structure so formed.

In one embodiment, the invention provides a semiconductor structure of a bulk silicon substrate layer, a relaxed silicon-germanium layer disposed on the bulk silicon substrate layer and including a thickness no greater than 500 angstroms and a strained single crystal silicon layer disposed on the silicon-germanium layer.

In another exemplary embodiment, the invention provides a semiconductor structure including a silicon layer, a silicon-germanium layer disposed on the silicon layer and a single crystal silicon layer disposed over the silicon-germanium layer. At least a portion of the silicon-germanium layer is substantially molten and the substantially molten portion extends from the silicon layer to the single crystal silicon layer.

In still another embodiment, the present invention provides a semiconductor structure including a silicon-germanium layer formed on a silicon substrate layer and a single crystal silicon layer formed on the silicon-germanium layer. The silicon-germanium layer and single crystal silicon layer are heat treated in one heating operation to enable the silicon-germanium layer to exhibit relaxed properties and the single crystal silicon layer to exhibit strained properties.

BRIEF DESCRIPTION OF THE DRAWING

The invention is best understood from the following detailed description when read in conjunction with the accompanying drawing. It is emphasized that, according to common practice, the various features of the drawing are not necessarily to scale. On the contrary, the dimensions of the various features may arbitrarily be expanded or reduced for clarity. Like numerals denote like features throughout the specification and drawing. Included are the following figures.

DETAILED DESCRIPTION

The present invention provides a method for forming multi-layered structures with strained heterojunctions, in semiconductor devices. A heterojunction is an electronic junction between materials of different bulk composition. Such strained semiconductor heterostructures are useful in a wide variety of device applications in semiconductor manufacturing, particularly those which benefit from enhanced carrier mobility within the structure. The invention is not limited to any particular application or structure and may find application in various optoelectronic devices and electronic devices. The strained heterojunction semiconductor devices of the present invention may be used, for example, in bipolar transistors or MOSFET's, particularly in the source/drain and/or channel regions of MOSFET's. The present invention provides an exemplary multi-layer $Si/Si_{1-x}Ge_x/Si$ heterojunction sandwich structure in which at least the silicon-germanium and upper silicon layers are formed by epitaxial growth.

Figure 1A:
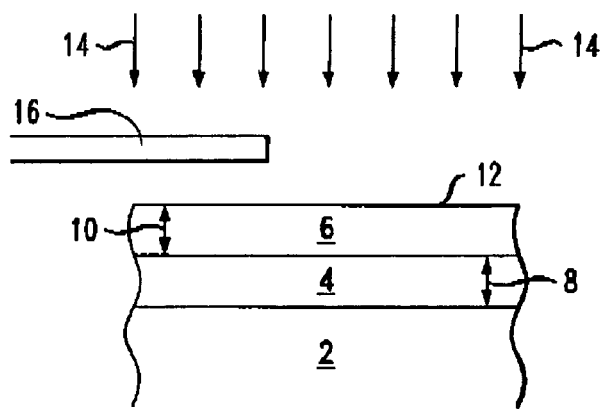
FIGS. 1A and 1B show an exemplary silicon/silicon-germanium/silicon heterostructure being heat treated by laser light.
Figure 1B:
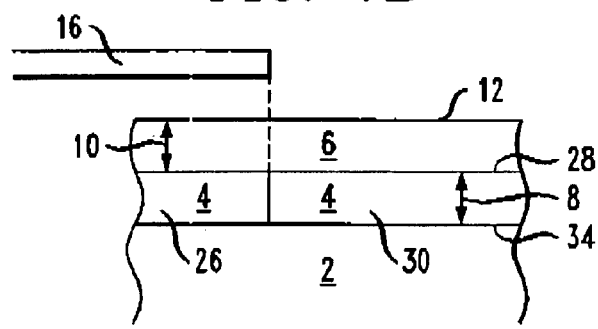
Figure 2:
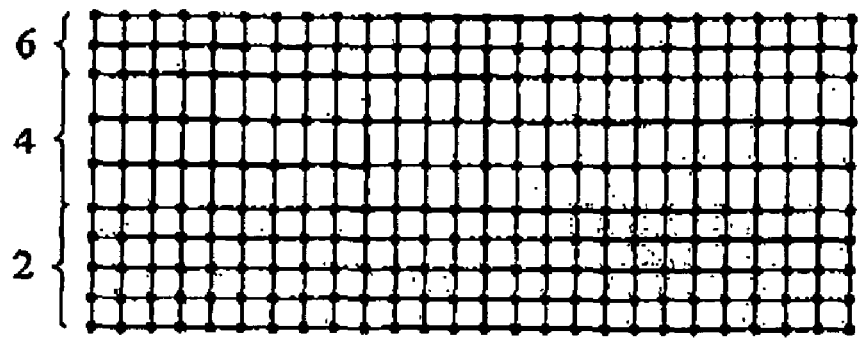
FIG. 2 schematically shows an atomic lattice of a single crystal silicon layer formed on a silicon-germanium layer formed on a silicon substrate layer.
Figure 4:
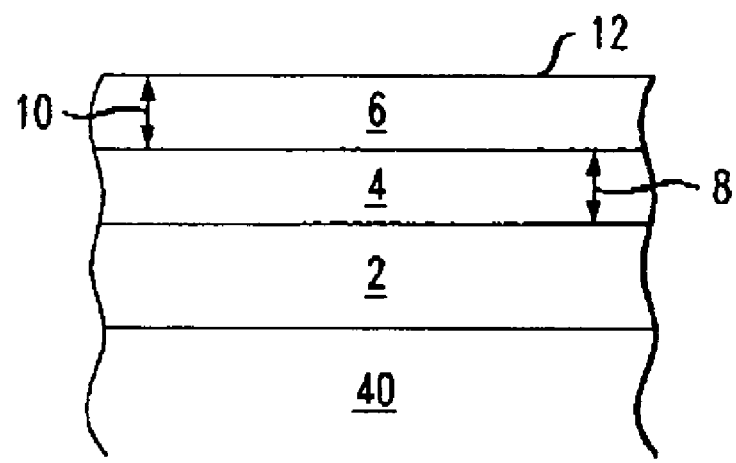
FIG. 4 shows another exemplary silicon/silicon-germanium/silicon heterostructure ea may be heated according to the invention.

FIGS. 1A and 1B show a cross-sectional view of an exemplary structure of the invention and FIG. 2 schematically shows an atomic lattice of the exemplary structure of the invention, as formed and prior to heat treatment. Additionally, FIGS. 1A and 1B also show an exemplary method of heat treatment in accordance with a method of the present invention. Referring to FIGS. 1A, 1B and 2, silicon-germanium layer 4 is formed over bottom Si layer 2. Bottom Si layer 2 may be a bulk silicon substrate in one exemplary embodiment. In another exemplary embodiment such as shown in FIG. 4, bottom Si layer 2 may be the silicon layer of an SOI (silicon-on-insulator) substrate, i.e., bottom Si layer 2 may be formed over insulating substrate 40. In another embodiment, bottom Si layer 2 may be another silicon layer formed over a substrate. Referring, still, to FIGS. 1A and 1B, silicon-germanium layer 4 is formed by epitaxial formation methods such as chemical vapor deposition (CVD) or molecular beam epitaxy (MBE), but various other epitaxial deposition methods may be used to form silicon-germanium film 4. The CVD-based epitaxial growth may take place at a temperature within the range of 800-1100° C. in an exemplary embodiment, and MBE methods typically utilize a lesser temperature. Thickness 8 of silicon-germanium layer 4 may be on the order of a few hundred angstroms. In one embodiment, thickness 8 may be less than 1200 angstroms and, in another embodiment, thickness 8 may be less than 500 angstroms, but other thicknesses may be used in other exemplary embodiments. As shown in FIG. 2, silicon-germanium layer 4 is substantially dislocation free upon formation and is under compressive stress upon formation. The degree of compressive stress may vary and depend upon thickness 8 of silicon-germanium film 4. The germanium concentration of the silicon-germanium film 4, represented by $Si_{1-x}Ge_x$, may vary and x may range from being substantially 0 to substantially 1.0. Germanium concentration x could be constant across silicon-germanium film 4 or there may be a Ge gradient as germanium concentration x may vary across silicon-germanium film 4.

An epitaxial growth process is then used to form top Si layer 6 over silicon-germanium layer 4. Various conventional epitaxial growth processes such as CVD or MBE may be used to form top Si layer 6. Thickness 10 of top Si layer 6 may range from 100 to 200 angstroms in an exemplary embodiment, and it may range from 100 to 500 angstroms in another exemplary embodiment, but other thicknesses may be used in other exemplary embodiments. Silicon-germanium layer 4 remains in compressive stress during the formation of top Si 6 layer, which is a single crystal silicon film in an exemplary embodiment. This single crystalline top Si layer 6 may serve as a Si channel in various applications in various semiconductor devices.

Prior to heat treating, the sandwich structure of $Si/Si_{1-x}Ge_x/Si$ may optionally be patterned such as to define active areas, for example. Conventional methods may be used. In one embodiment, only Si layer 2 is patterned; in another embodiment, Si layer 2 and silicon-germanium layer 4 are patterned; and in another embodiment, all three layers 2, 4 and 6 are patterned.

The sandwich structure of $Si/Si_{1-x}Ge_x/Si$ is then heat treated to selectively melt the $Si_{1-x}Ge_x$ as afforded by the lower melting point of silicon-germanium compared to that crystalline silicon. In an exemplary embodiment, crystalline silicon may have a melting point of around 1400° C. and silicon-germanium may have melting point of about 900° C., but the melting point of the $Si_{1-x}Ge_x$ will vary depending on the germanium concentration, i.e., the value of x. As the value of x increases, the disparity in relative melting points also increases. In one exemplary embodiment, the heat treating may be done by rapid thermal annealing, RTA. In another exemplary embodiment, laser annealing may be used. The laser may be pulsed or a continuous wave laser. FIG. 1A shows laser light, indicated by arrows 14, directed toward surface 12 of the multi-layer semiconductor structure. Various lasers such as an XeCl or other excimer lasers may be used. The laser energy is adjusted to selectively melt silicon-germanium layer 4 but not top Si layer 6. Various energies may be used and may depend upon the germanium concentration of silicon-germanium layer 4. For a pulsed laser, the laser energy may further depend on the number and/or frequency of pulses used and the power density and energy are chosen in conjunction with thickness 8 silicon-germanium layer 4. In an exemplary embodiment, a laser power density in the range of 0.1 to 1.0 W/cm$^2$ may be used to melt about 1000 angstroms of silicon-germanium but other power densities may be used in other exemplary embodiments. The wavelength of laser light is chosen to be a wavelength that is absorbable by silicon and in exemplary embodiment, a wavelength less than 11000 Å may be used. The heat treatment process causes silicon-germanium layer 4 to substantially or completely melt while top Si layer 6 remains a solid single crystalline material. Prior to cooling, the heat treated silicon-germanium layer 4 may be in its completely or substantially molten, i.e. melted or liquefied, state from its upper border with top Si layer 6 to its lower border with bottom Si layer 2.

Figure 1C:
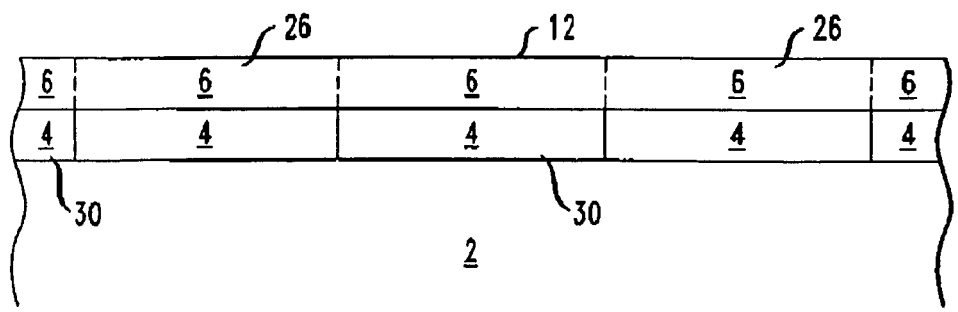
FIG. 1C shows a silicon-germanium layer with some sections substantially melted and other laterally adjacent sections, not melted.

According to the laser anneal heat treatment embodiment, the laser treatment may blanket the entire substrate or it may be spatially selective. According to the spatially selective embodiment such as illustrated in FIGS. 1A and 1B, designated sections of silicon-germanium layer 4 may be subjected to and substantially melted, i.e., changed from a solid to a liquid state by laser light and other sections, disposed laterally next to the melted sections, may not. For example, only selected regions such as NMOS transistor regions may be laser annealed. In one embodiment, a narrow laser beam may be directed to desired portions of the substrate and in another exemplary embodiment, such as shown in FIG. 1A, mask 16 may used to reflect and/or absorb laser light, indicated by arrows 14, and prevent laser annealing of underlying portions of the multi-layered structure. FIG. 1B shows underlying portions 26 in which the laser annealing is blocked and silicon-germanium layer 4 is unchanged and the films in the non-heat treated section remain substantially as deposited. In heat treated portions 30, silicon-germanium layer 4 may be completely or substantially molten from upper border 28 with top Si layer 6 to its lower border 34 with bottom Si layer 2. FIG. 1C shows underlying portions 26 in which the laser annealing is blocked and silicon-germanium layer 4 is unchanged and not melted, i.e. underlying portions 26 are solid portions, disposed laterally next to melted sections, I.e. heat treated portions 30.

Figure 3:
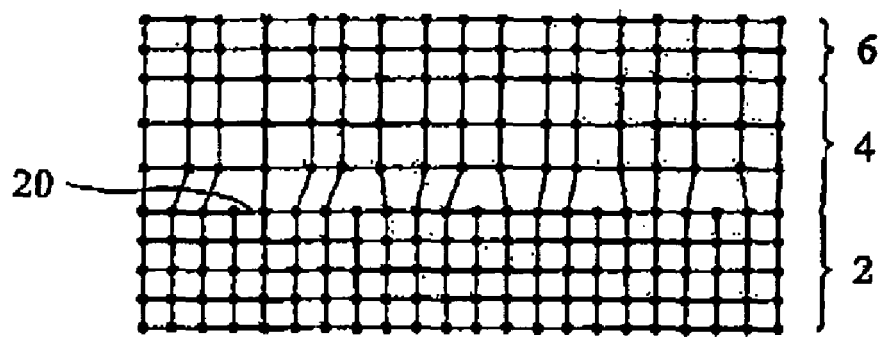
FIG. 3 schematically shows an atomic lattice of the single crystal silicon layer/silicon-germanium layer/silicon substrate layer structure, after heat treatment and cooling.

As a result of the heat treating operation, which may be a single and substantially continuous heat treating operation as described above, silicon-germanium layer 4 becomes relaxed. After this heat treating operation, the structure cools and the silicon-germanium layer 4 solidifies. Passive or active cooling techniques may be used. As silicon-germanium layer 4 cools and solidifies, this relaxed layer forces top Si layer 6 to expand and strain is created in top Si layer 6, which substantially continuously binds to silicon-germanium layer 4. Strained top Si Layer 6 may advantageously have a lattice constant essentially equal to that of the relaxed silicon-germanium layer 4, to which it binds. As such, after the heat treatment, including a subsequent cooling operation, the multilayer heterostructure includes strained top Si layer 6 disposed over relaxed, solidified silicon-germanium layer 4 which is disposed, in turn, over bottom silicon layer 2, as shown in FIG. 3. During and after the heat treatment process, dislocations 20 may occur as shown in FIG. 3, to enable silicon-germanium layer 4 to remain a relaxed film.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventor to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical,", "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the structure be constructed or used in a particular orientation.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A semiconductor structure comprising a silicon layer, a silicon-germanium layer disposed directly on said silicon layer and a single crystal silicon layer disposed over said silicon-germanium layer, at least a portion of said silicon-germanium layer being in a substantially liquid state formed by laser and extending from said silicon layer to said single crystal silicon layer and at least a further portion of said silicon-germanium layer being solid and extending from said silicon layer to said single crystal silicon layer.

2. The semiconductor structure as in claim 1, wherein said silicon layer is disposed over an insulating substrate.

3. The semiconductor structure as in claim 1, wherein said at least a portion of said silicon-germanium layer comprises a plurality of spatially separated liquid sections.

4. The semiconductor structure as in claim 3, wherein said silicon-germanium layer is patterned and each said further portion of said silicon-germanium layer is relaxed and spatially separated by said spatially separated liquid sections.

5. The semiconductor structure as in claim 1, wherein said single crystal silicon layer substantially continuously binds to at least one said further portion of said silicon-germanium layer and includes a lattice constant that substantially matches a lattice constant of said silicon-germanium layer.

6. The semiconductor structure as in claim 1, wherein said single crystal silicon layer is strained and said at least a further portion is relaxed.

7. A semiconductor structure comprising:
   a first section comprising a bulk silicon substrate layer, a silicon-germanium layer formed directly on said bulk silicon substrate layer, said silicon-germanium layer including a first section thickness no greater than 500 angstroms and being in a stressed state, and a single crystal silicon layer disposed directly on said silicon-germanium layer; and
   a second section, disposed laterally next to the first section, comprising said bulk silicon substrate layer, said silicon-germanium layer formed directly on said bulk silicon substrate layer, said silicon-germanium layer including a second section thickness no greater than 500 angstroms and being in a fully relaxed state, and said single crystal silicon layer disposed directly on said silicon-germanium layer and being in a strained state.

8. The semiconductor structure as in claim 7, wherein said single crystal silicon layer in a strained state substantially continuously binds to said silicon-germanium layer in said second section being in a fully relaxed state, wherein said single crystal silicon layer in a strained state includes a lattice constant that substantially matches a lattice constant of said silicon-germanium layer.

9. The semiconductor structure as in claim 7, wherein said bulk silicon substrate layer is disposed over an insulating substrate.

10. A semiconductor structure comprising a silicon layer, a silicon-germanium layer disposed directly on said silicon layer and a single crystal silicon layer disposed over said silicon-germanium layer, at least a first portion of said silicon-germanium layer being in a substantially liquid state, said first portion extending from said silicon layer all the way to said single crystal silicon layer and at least a second portion of said silicon-germanium layer being solid, said second portion extending from said silicon layer all the way to said single crystal silicon layer, said silicon-germanium layer having a thickness greater than a few angstroms and no greater than 1200 angstroms.

* * * * *